(12) United States Patent
Na

(10) Patent No.: US 10,020,868 B2
(45) Date of Patent: Jul. 10, 2018

(54) COMMUNICATION MODULE ASSEMBLY

(71) Applicant: SOLiD, INC., Seongnam-si, Gyeonggi-do (KR)

(72) Inventor: Sejun Na, Anyang-si (KR)

(73) Assignee: SOLiD, INC., Seongnam-si (KR)

( * ) Notice: Subject to any disclaimer, the term of this patent is extended or adjusted under 35 U.S.C. 154(b) by 0 days.

(21) Appl. No.: 15/397,985

(22) Filed: Jan. 4, 2017

(65) Prior Publication Data

US 2017/0201312 A1 Jul. 13, 2017

(30) Foreign Application Priority Data

Jan. 7, 2016 (KR) ........................ 10-2016-0002281

(51) Int. Cl.
*H04B 7/15* (2006.01)
*H04B 7/155* (2006.01)
*H05K 5/00* (2006.01)

(52) U.S. Cl.
CPC ........... *H04B 7/155* (2013.01); *H05K 5/0021* (2013.01)

(58) Field of Classification Search
CPC ............................. H04B 7/155; H05K 5/0021
See application file for complete search history.

(56) References Cited

U.S. PATENT DOCUMENTS

| | | | | |
|---|---|---|---|---|
| 6,780,044 B1* | 8/2004 | Sawyer | ................ | H01R 4/2433 200/61.62 |
| 2001/0044167 A1* | 11/2001 | Kuo | ..................... | H01L 23/051 438/106 |
| 2010/0112862 A1* | 5/2010 | Chiu | ................ | H01R 13/65802 439/607.23 |
| 2010/0294750 A1* | 11/2010 | Hogenmueller | ...... | B60R 16/023 219/202 |
| 2011/0183533 A1* | 7/2011 | Cedillo Vazquez | ............ | H01R 13/4534 439/106 |
| 2011/0216510 A1* | 9/2011 | Matsumura | .............. | H02G 3/00 361/733 |
| 2013/0008873 A1* | 1/2013 | Siegenthaler | ............ | H01H 1/54 218/146 |
| 2013/0066514 A1* | 3/2013 | Das | ........................ | G07C 5/008 701/31.5 |
| 2013/0176181 A1* | 7/2013 | Mo | ........................ | H01Q 1/243 343/702 |
| 2013/0189933 A1* | 7/2013 | Heitmeier | ............ | H04B 1/3805 455/90.1 |
| 2013/0271890 A1* | 10/2013 | Spalding | ................ | H01C 7/126 361/111 |
| 2015/0294616 A1* | 10/2015 | Jang | ..................... | G09G 3/3208 345/691 |
| 2015/0343790 A1* | 12/2015 | Inoue | ................... | B41J 2/17523 347/85 |
| 2016/0113140 A1* | 4/2016 | Chang | .................... | H04N 7/104 361/679.01 |
| 2017/0133744 A1* | 5/2017 | An | ....................... | H01Q 1/2291 |

* cited by examiner

*Primary Examiner* — Dominic Rego
(74) *Attorney, Agent, or Firm* — Sughrue Mion, PLLC

(57) ABSTRACT

A communication module assembly includes a case; a communication module accommodated in the case and including at least two module terminals; and a connection member including connection terminals respectively connected to the module terminals, and a bridge unit configured to connect the connection terminals, wherein when the connection terminals and the module terminals are disconnected, the connection terminals are electrically connected to each other through the bridge unit.

7 Claims, 5 Drawing Sheets

COMMUNICATION MODULE ASSEMBLY

CROSS-REFERENCE TO RELATED APPLICATION

This application claims priority from Korean Patent Application No. 10-2016-0002281, filed on Jan. 7, 2016, in the Korean Intellectual Property Office, the disclosure of which is incorporated herein in its entirety by reference.

BACKGROUND

1. Field

The inventive concept relates to a communication module assembly.

2. Description of the Related Art

As a penetration rate of a mobile communication terminal is increased due to the development of communication technology and desire for user's needs and communication quality are increased, a mobile communication repeater is spreading to meet the demands. The mobile communication repeater is a device that connects a base station and a terminal.

In addition, even though the base station can receive radio frequency signals from an exchanger of a mobile communication provider to enable communication services, the mobile communication repeater is used to transmit radio frequency signals of the base station more accurately and further because of the limited range of radio frequency signals from the base station. Usually, a large number of mobile telecommunication repeaters are installed in small cities or mountainous areas that are far away from base stations rather than big cities.

Various types of mobile communication repeaters have been disclosed for various purposes. Typical mobile communication repeaters include an optical repeater and a radio frequency (RF) repeater. The optical repeater has a method of receiving radio frequency signals of a base station located closest to an area where the optical repeater is installed and transmitting the radio frequency signals to an area where radio frequency signals are unstable or communication quality is weak through an optical cable. The RF repeater is a wireless communication device for solving a shaded area of underground or ground where it is difficult to transmit signals, and is used for smooth communication by providing signal amplification and a radio path between a base station and a terminal.

The mobile communication repeater has a case and various internal components for communication repeat in the case. Depending on the situation, required internal components of the mobile communication repeater may be different. In a conventional mobile communication repeater, if one of the internal components is disconnected, electrical connection to other internal components is cut off and a separate cable needs to be connected. In particular, considering that the mobile communication repeater is mounted and used in a place where user's accessibility is difficult, such as an upper end of a telephone pole, it is difficult to separate internal components. Therefore, countermeasures are required.

SUMMARY

The inventive concept is directed to a communication module assembly capable of maintaining electrical connection even if a communication module is disconnected.

Additional aspects will be set forth in part in the description which follows and, in part, will be apparent from the description, or may be learned by practice of the presented example embodiments.

According to an aspect of the inventive concept, there is provided a communication module assembly, the communication module assembly includes: a case; a communication module accommodated in the case and including at least two module terminals; and a connection member including connection terminals respectively connected to the module terminals, and a bridge unit configured to connect the connection terminals, wherein when the connection terminals and the module terminals are disconnected, the connection terminals are electrically connected to each other through the bridge unit.

According to an exemplary embodiment, wherein, when the connection terminals and the module terminals are connected to each other, the connection terminals may be electrically connected to each other through the communication module.

According to an exemplary embodiment, wherein, when the connection terminals and the module terminals are connected to each other, the electrical connection through the bridge unit may be disconnected.

According to an exemplary embodiment, wherein at least one of the connection terminals may include a first contact portion and the bridge unit includes a second contact portion, and the connection terminals may be electrically connected to each other by contact between the first and second contact portions.

According to an exemplary embodiment, wherein the connection terminal including the first contact portion may further include an elastic portion, and the elastic portion may apply elastic force to the first contact portion to push the first contact portion in a direction adjacent to the second contact portion.

According to an exemplary embodiment, wherein, when the connection terminals and the module terminal are connected to each other, the communication module may push the first contact portion away from the second contact portion to disconnect the first and second contact portions.

According to an exemplary embodiment, wherein the communication module may be plural.

According to an exemplary embodiment, wherein the connection member may further include a connection line unit for electrically connecting the connection terminals of the plurality of communication modules to each other.

According to an exemplary embodiment, wherein, when the module terminals of some of the plurality of communication modules are disconnected from the connection terminals, electrical signals may be transmitted to adjacent communication module through the bridge unit of the connection member corresponding to the disconnected communication modules.

According to the inventive concept, since a bridge unit electrically connects connection terminal units when a communication module is disconnected, it is possible to maintain the electrical connection even if the communication module is disconnected, thereby facilitating an arrangement and the like of the communication module.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
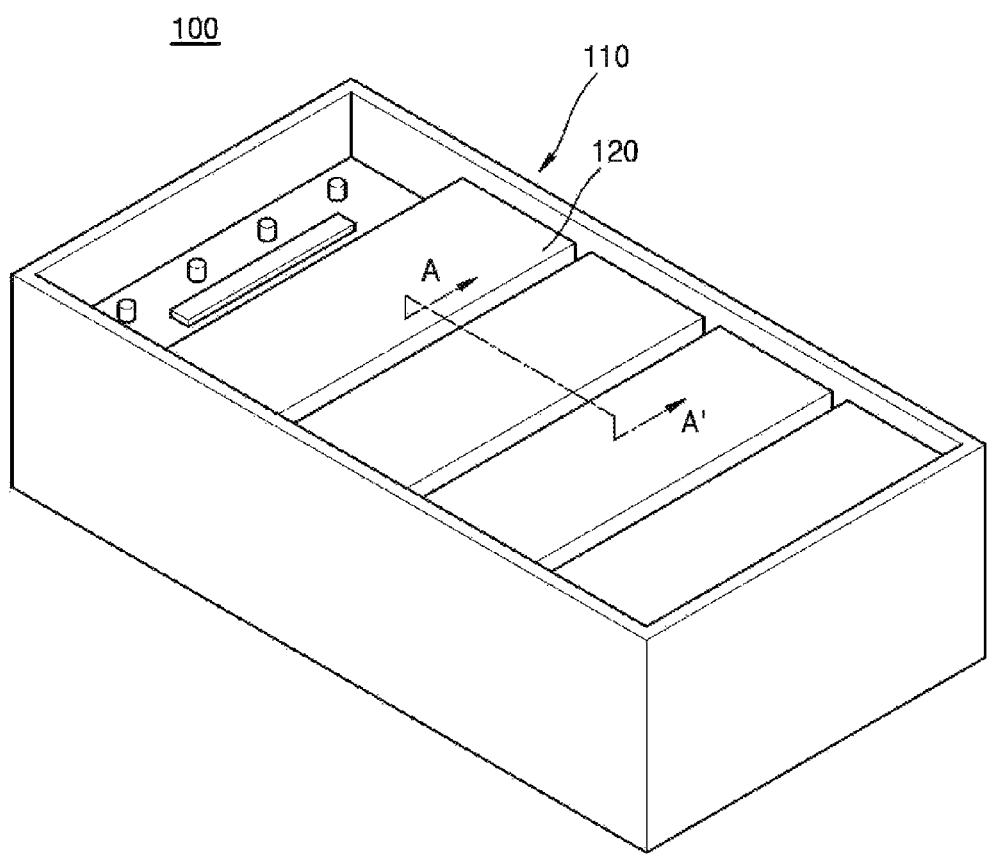
FIG. 1 is a perspective view of a communication module assembly according to an example embodiment of the inventive concept.

The inventive concept may be variously modified and have various example embodiments, so that specific example embodiments will be illustrated in the drawings and described in the detailed description. However, this does not limit the inventive concept to specific example embodiments, and it should be understood that the inventive concept covers all the modifications, equivalents and replacements included within the idea and technical scope of the inventive concept.

In describing the inventive concept, in the following description, a detailed explanation of known related technologies may be omitted to avoid unnecessarily obscuring the subject matter of the inventive concept. In addition, numeral figures (for example, 1, 2, and the like) used during describing the specification are just identification symbols for distinguishing one element from another element. Further, in the specification, if it is described that one component is "connected" or "accesses" the other component, it is understood that the one component may be directly connected to or may directly access the other component but unless explicitly described to the contrary, another component may be "connected" or "access" between the components. In addition, terms including "unit", "er", "or", "module", and the like disclosed in the specification mean a unit that processes at least one function or operation and this may be implemented by hardware or software or a combination of hardware and software.

Moreover, it is intended to clarify that components in the specification are distinguished in terms of primary functions of the components. That is, two or more components to be described below may be provided to be combined to one component or one component may be provided to be divided into two or more components for each more subdivided function. In addition, each of the respective components to be described below may additionally perform some or all functions among functions which other components take charge of in addition to a primary function which each component takes charge of and some functions among the primary functions which the respective components take charge of are exclusively charged by other components to be performed, of course.

Hereinafter, example embodiments of the inventive concept will be described in detail.

FIG. 1 is a perspective view of a communication module assembly 100 according to an example embodiment of the inventive concept. Hereinafter, the communication module assembly 100 according to an example embodiment of the inventive concept will be described with reference to FIG. 1. Here, the communication module assembly 100 includes a mobile communication repeater, a node unit constituting a distributed antenna system, for example, a head-end unit for interfacing with a base station, an expansion unit, or a remote unit that is disposed at a remote location and transmits a mobile communication signal to a terminal within service coverage. However, the inventive concept is not limited thereto, and the communication module assembly 100 may be applied to any assembly requiring a communication module performing a specific function.

As illustrated in FIG. 1, the communication module assembly 100 according to an embodiment of the present invention may include a case 110, a communication module 120, and a connection member 130 (see FIGS. 2 through 5).

The case 110 is a member having a space therein to accommodate one or more communication modules 120.

The case 110 occupies most of the communication module assembly 100 and may have a hexahedron shape having a certain volume therein to accommodate the communication modules 120. However, a shape of the case 110 is not limited thereto, and any shape can be used as long as it can accommodate the communication module 120.

Although FIG. 1 illustrates that the communication module 120 is externally exposed by opening one side of the case 110 of the communication module assembly 100, the inventive concept is not limited thereto. The communication module 120 can be protected from the outside by implementing all sides of the case 110 to be closed or one side opened through a separate door to be opened and closed. Here, if the case 110 has a separate door, the door may be hinged to the case 110 and may include a separate locking/unlocking unit to fix the door to the case 110 in a locked state, for example, as a latch system.

The communication module 120 may include various internal components as a member having a communication function.

Here, the communication module 120 may be single or plural, and may have different functions when the communication module 120 is plural. The communication modules 120 are for implementing a function of amplifying a signal of a predetermined frequency band, a function of filtering a signal and canceling an interference phenomenon of an electromagnetic wave, a function of filtering a bidirectional signal, and a combination of the functions, respectively.

For example, when the communication module assembly 100 is used as a radio frequency (RF) repeater, the communication module 120 may be configured to include any one of unit modules such as an RF up-converter (UPC) module, an RF down-converter (DNC) module, an RF amplification module, and a filter module, or a combination thereof.

As another example, when the communication module assembly 100 is used as a remote unit of a distributed antenna system, the communication module 120 may be configured to include any one of unit modules such as a module for processing RF signals by frequency band, a module for combining RF signals by frequency band, and a module for converting RF signals into signals of a type corresponding to a transmission medium, or a combination thereof.

Meanwhile, a module terminal unit 121 including at least two module terminals (see FIG. 2) may be provided on a lower surface of the communication module 120, and the module terminal units 121 may connect an external electrical signal to the communication module 120.

Figure 2:
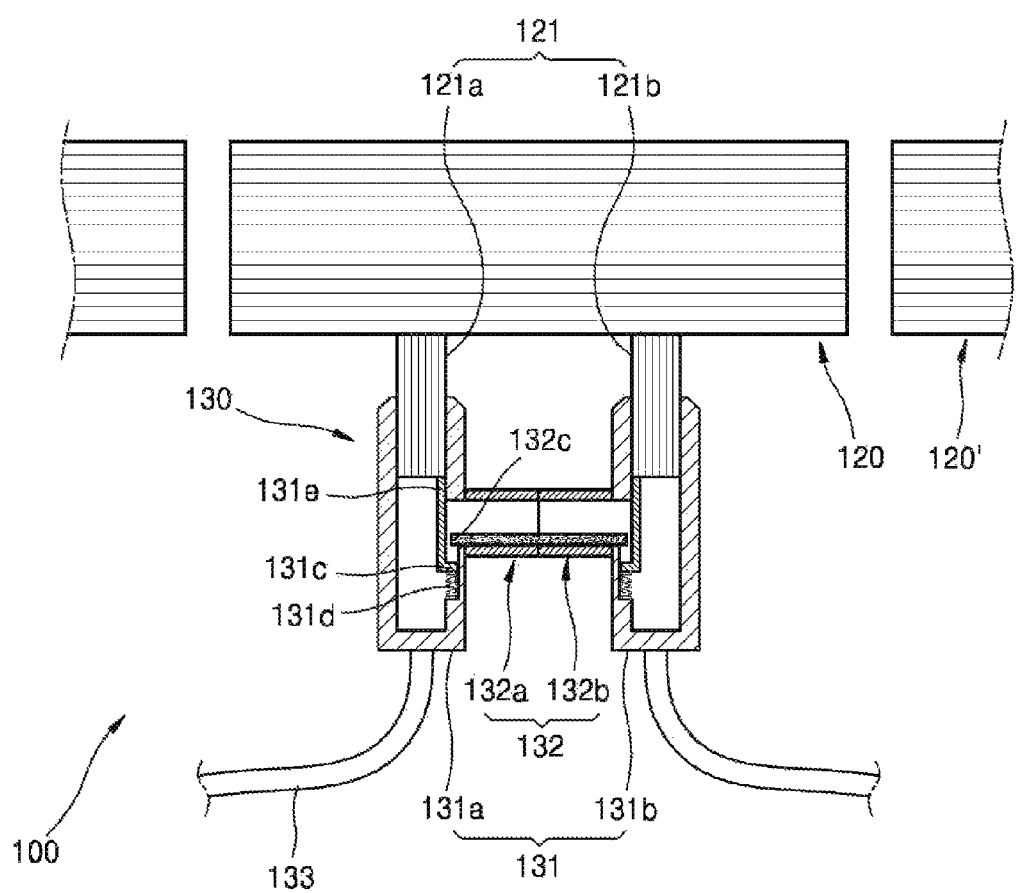
FIG. 2 is a cross-sectional view taken along lines A-A' of a part of the communication module assembly of FIG. 1 according to an example embodiment of the inventive concept.
Figure 3:
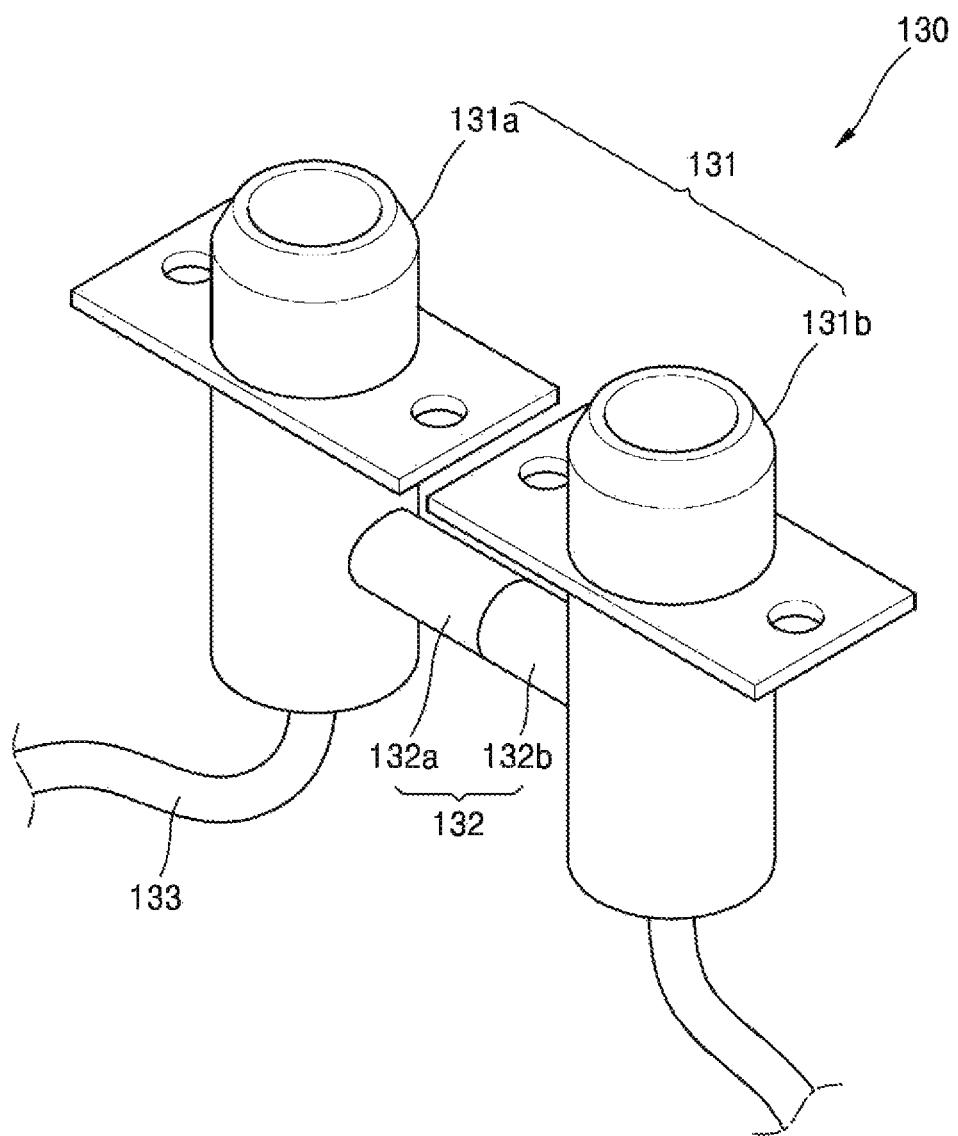
FIG. 3 is a perspective view of a connection member of the communication module assembly of FIG. 2 according to an example embodiment of the inventive concept.

FIG. 2 is a cross-sectional view taken along lines A-A' of a part of the communication module assembly 100 of FIG. 1 according to an example embodiment of the inventive concept, and FIG. 3 is a perspective view of the connection member 130 of the communication module assembly 100 of FIG. 2 according to an example embodiment of the inventive concept. Hereinafter, the connection member 130 according to an example embodiment of the inventive concept will be described with reference to FIG. 2. The connection member 130 may include a connection terminal unit 131 connected to the module terminal unit 121 and a bridge unit 132 connecting between the connection terminals 131a and 131b as shown in FIGS. 2 and 3.

The connection terminal unit 131 may be connected to the module terminal unit 121 to electrically connect the communication module 120 and the connection member 130. For example, by a plug-in method, the module terminal unit 121 having a projecting shape and the connection terminal unit 131 having an accommodating shape may be physically and electrically connected to each other by fastening to each other. Meanwhile, the module terminal unit 121 may be provided in the communication module 120 with at least two module terminals. The connection terminal unit 131 may include at least two or more connection terminals to correspond to the module terminal unit 121. For convenience of description, the communication module 120 is described in an example embodiment of the inventive concept as having the module terminal unit 121 including two module terminals. However, the inventive concept is not limited thereto, but the number of the module terminals may be more than two (for example, four).

In an example embodiment of the inventive concept, the connection terminal unit 131 may include a first connection terminal 131a connected to a first module terminal 121a and a second connection terminal 131b connected to a second module terminal 121b. For example, electrical communication is performed in an order of the first connection terminal 131a, the first module terminal 121a, a main body of the communication module 120, the second module terminal 121b, and the second connection terminal 131b.

Meanwhile, the first connection terminal 131a and the second connection terminal 131b may be connected to each other through the bridge unit 132. Here, the bridge unit 132 includes, for example, a first bridge 132a extending in a horizontal direction from the middle of the first connection terminal 131a and a second bridge 132b extending in a horizontal direction adjacent to the first bridge 132a from the middle of the second connection terminal 131b so that the first and second bridges 132a and 132b may be physically and electrically connected to each other. For example, any one of the first and second bridges 132a and 132b may have a projecting shape and the other may have an accommodating shape so that the first and second bridges 132a and 132b may be physically and electrically combined to each other.

The communication module assembly 100 according to an example embodiment of the inventive concept may further include a connection line unit 133. The connection line unit 133 may electrically connect the connection terminal unit 131 of the connection member 130 and a connection terminal unit (a connection member corresponding to a communication module 120') of another adjacent connection member or may electrically connect input/output terminals of the communication module assembly 100. As a result, an electrical signal can be smoothly supplied to the communication module assembly 100 including the plurality of communication modules 120 through the connection line unit 133.

Figure 4:
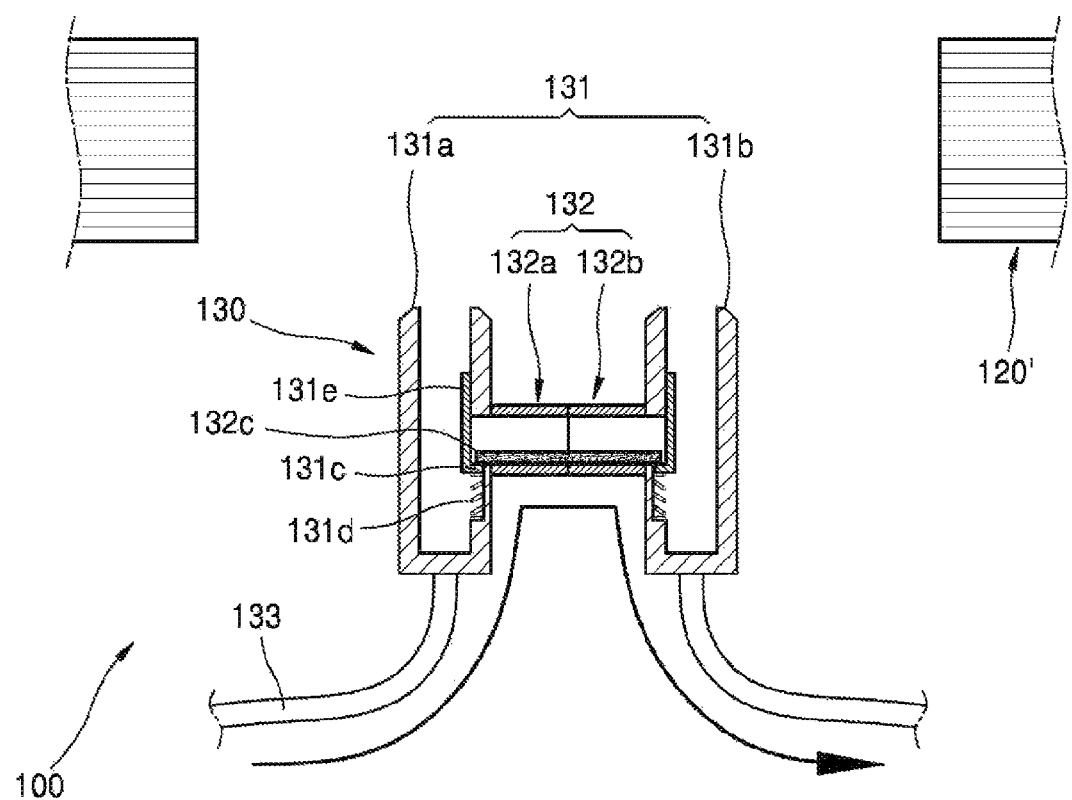
FIG. 4 is a cross-sectional view of a state in which at least one of communication modules of the communication module assembly of FIG. 1 according to an example embodiment of the inventive concept is disconnected.
Figure 5:
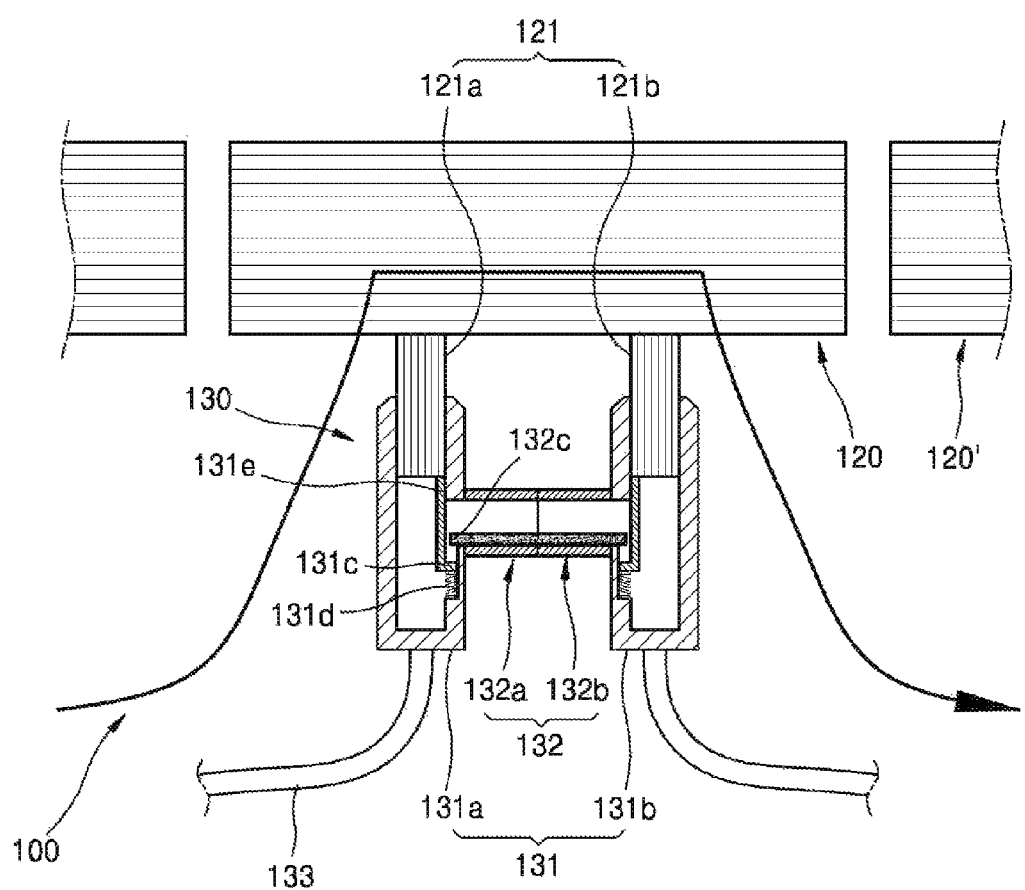
FIG. 5 is a cross-sectional view of a state in which a communication module is combined to the communication module assembly of FIG. 4 according to an example embodiment of the inventive concept.

FIG. 4 is a cross-sectional view of a state in which at least one of the communication modules 120 of the communication module assembly 100 of FIG. 1 according to an example embodiment of the inventive concept is disconnected, and FIG. 5 is a cross-sectional view of a state in which the communication module 120 is combined to the communication module assembly 100 of FIG. 4 according to an example embodiment of the inventive concept. Hereinafter, functions of the connection member 130 according to an example embodiment of the inventive concept will be described in more detail with reference to FIGS. 4 and 5.

As illustrated in FIGS. 4 and 5, in the connection member 130 according to an example embodiment of the inventive concept, at least one of the first and second connection terminals 131a and 131b may include a first contact portion 131c and an elastic portion 131d and the bridge unit 132 may include a second contact portion 132c. Furthermore, the elastic portion 131d of the connection terminal unit 131 may apply an elastic force to the first contact portion 131c to push the first contact portion 131c of the connection terminal unit 131 in a direction adjacent to the second contact portion 132c of the bridge unit 132. Here, the first and second contact portions 131c and 132c, and the elastic portion 131d may maintain an electrical connection to the communication module assembly 100 through the bridge unit 132 even if the communication module 120 is disconnected from the communication module assembly 100.

First, as illustrated in FIG. 4, when the module terminal unit 121 of the communication module 120 is disconnected from the connection terminal unit 131 of the connection member 130, the elastic portion 131d applies an elastic force to the first contact portion 131c to push the first contact portion 131c toward the second contact portion 132c of the bridge unit 132, and thus the first contact portion 131c and the second contact portion 132c may contact each other. As a result, power and signals input through the first connection terminal 131a may be transmitted to the second connection terminal 131b through the first and second contact portions 131c and 132c of the bridge unit 132. Since the connection member 130 can electrically connect the connection terminals 131a and 131b through the bridge unit 132 even if the communication module 120 is disconnected from the communication module assembly 100, it is possible to avoid an inconvenient operation such as electrically connecting the first and second connection terminals 131a and 131b through separate cable connection after the communication module 120 is disconnected from the communication module assembly 100. Accordingly, a user may easily connect only a necessary communication module 120 in the case 110 and disconnect an unnecessary communication module 120. In particular, it is possible to provide convenience to the communication module assembly 100 located in a place where access is inconvenient, such as a telephone pole.

Meanwhile, as illustrated in FIG. 5, when the module terminal unit 121 of the communication module 120 is connected to the connection terminal unit 131 of the connection member 130, the module terminal unit 121 is fastened to the connection terminal unit 131 and presses a pressing portion 131e connected to the first contact portion 131c. Thus, the first contact portion 131c may receive force in a direction away from the second contact portion 132c (downward in FIG. 5). The force applied to the pressing portion 131e by the module terminal unit 121 may be greater than the elastic force of the elastic portion 131d so that the first contact portion 131c is separated from the second contact portion 132c and the first contact portion 131c and the second contact portion 132c may be disconnected. Therefore, the electrical connection between the first connection terminal 131a and the second connection terminal 131b through the bridge unit 132 may also be disconnected and the first connection terminal 131a and the second connection terminal 131b may be electrically connected to each other through the communication module 120 connected to each of the first and second module terminals 121a and 121b. Furthermore, an electrical signal output through the communication module 120 may be transmitted to the communication module 120' or the input/output terminals of the communication module assembly 100 through the connection line unit 133.

That is, according to the communication module assembly 100 according to an example embodiment of the inventive concept, when the communication module 120 is mounted on the communication module assembly 100, the first connection terminal 131a and the second connection terminal 131b are electrically connected to each other through the communication module 120, and when the communication module 120 is disconnected from the communication module assembly 100, the first connection terminal 131a and the second connection terminal 131b may be electrically connected to each other through the bridge unit 132.

In particular, when the communication module 120 is plural, even if any one of the communication modules 120 is separated from the communication module assembly 100, electrical connection of the separated communication module 120 is maintained through the bridge unit 32. Therefore, various communication modules 120 may be combined in the same case 110 when assembling the communication module assembly 100.

In terms of electrical connection, connection and disconnection of each communication module 120 to the communication module assembly 100 may be free, thereby providing convenience in design and use.

It should be understood that example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope of the disclosure as defined by the following claims.

What is claimed is:

1. A communication module assembly comprising:
a case;
a communication module accommodated in the case and including at least two module terminals; and
a connection member including connection terminals respectively connected to the module terminals, and a bridge unit configured to connect the connection terminals,
wherein when the connection terminals and the module terminals are disconnected, the connection terminals are electrically connected to each other through the bridge unit,
wherein at least one of the connection terminals includes a first contact portion and the bridge unit includes a second contact portion, and the connection terminals are electrically connected to each other by contact between the first and second contact portions, and
wherein, when the connection terminals and the module terminals are connected to each other, the communication module pushes the first contact portion away from the second contact portion to disconnect the first and second contact portions.

2. The communication module assembly of claim 1, wherein,
when the connection terminals and the module terminals are connected to each other, the connection terminals are electrically connected to each other through the communication module.

3. The communication module assembly of claim 2, wherein,
when the connection terminals and the module terminals are connected to each other, the electrical connection through the bridge unit is disconnected.

4. The communication module assembly of claim 1, comprising a plurality of communication modules accommodated in the case, including the communication module, wherein each of the plurality of communication modules includes at least two module terminals.

5. The communication module assembly of claim 4, wherein
the connection member further comprises a connection line unit for electrically connecting the connection terminals of the plurality of communication modules to each other.

6. A communication module assembly comprising:
a case;
a communication module accommodated in the case and including at least two module terminals; and
a connection member including connection terminals respectively connected to the module terminals, and a bridge unit configured to connect the connection terminals,
wherein when the connection terminals and the module terminals are disconnected, the connection terminals are electrically connected to each other through the bridge unit,
wherein at least one of the connection terminals includes a first contact portion and the bridge unit includes a second contact portion, and the connection terminals are electrically connected to each other by contact between the first and second contact portions,
wherein the connection terminal including the first contact portion further includes an elastic portion, and
wherein the elastic portion applies elastic force to the first contact portion to push the first contact portion in a direction adjacent to the second contact portion.

7. A communication module assembly comprising:
a case;
a plurality of communication modules accommodated in the case, each of the plurality of communication modules including at least two module terminals; and
a connection member including connection terminals respectively connected to module terminals of a communication module among the plurality of communication modules and a bridge unit configured to connect the connection terminals,
wherein, when the connection terminals and the module terminals are disconnected, the connection terminals are electrically connected to each other through the bridge unit and electrical signals are transmitted to an adjacent communication module among the plurality of communication modules through the bridge unit.

\* \* \* \* \*